US006975137B1

(12) United States Patent
Schadt et al.

(10) Patent No.: US 6,975,137 B1
(45) Date of Patent: *Dec. 13, 2005

(54) PROGRAMMABLE LOGIC DEVICES WITH INTEGRATED STANDARD-CELL LOGIC BLOCKS

(75) Inventors: John A. Schadt, Bethlehem, PA (US); William B. Andrews, Emmaus, PA (US); Zheng Chen, Macungie, PA (US); Anthony K. Myers, Hamburg, PA (US); David A. Rhein, Reading, PA (US); Warren L. Ziegenfus, Emmaus, PA (US); Fulong Zhang, Willow Grove, PA (US); Ming Hui Ding, Allentown, PA (US); Larry R. Fenstermaker, Nazareth, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 3 days.

This patent is subject to a terminal disclaimer.

(21) Appl. No.: 11/055,280

(22) Filed: Feb. 10, 2005

Related U.S. Application Data

(63) Continuation of application No. 10/391,094, filed on Mar. 18, 2003, now Pat. No. 6,870,395.

(51) Int. Cl.[7] .......................... G06F 7/38; G06F 17/50; H03K 19/177; H03K 19/00
(52) U.S. Cl. ......................................... 326/39; 716/16
(58) Field of Search .............................. 326/40, 39, 41; 257/786; 712/11; 713/401; 716/2, 16, 18

(56) References Cited

U.S. PATENT DOCUMENTS

| 5,671,432 A | 9/1997 | Bertolet ...................... 712/11 |
| 5,825,202 A | 10/1998 | Tavana ......................... 326/39 |
| 5,880,598 A | 3/1999 | Duong ......................... 326/41 |
| 6,020,755 A | 2/2000 | Andrews ...................... 326/39 |
| 6,054,872 A | 4/2000 | Fudanuki ..................... 326/39 |
| 6,154,051 A | 11/2000 | Nguyen ....................... 326/41 |
| 6,184,713 B1 * | 2/2001 | Agrawal et al. ............... 326/41 |
| 6,191,612 B1 | 2/2001 | Agrawal ...................... 326/39 |
| 6,292,020 B1 | 9/2001 | Crabill ........................ 326/41 |
| 6,297,565 B1 | 10/2001 | Shiflet ........................ 257/786 |
| 6,404,226 B1 | 6/2002 | Schadt ........................ 326/41 |
| 6,490,707 B1 | 12/2002 | Baxter ......................... 716/2 |
| 6,515,509 B1 | 2/2003 | Baxter ......................... 326/39 |
| 6,526,563 B1 | 2/2003 | Baxter ......................... 716/18 |
| 6,629,308 B1 | 9/2003 | Baxter ......................... 716/16 |
| 6,650,142 B1 * | 11/2003 | Agrawal et al. ............... 326/41 |
| 6,675,309 B1 | 1/2004 | Baxter ......................... 713/401 |
| 6,870,395 B2 * | 3/2005 | Schadt et al. ................. 326/41 |

OTHER PUBLICATIONS

U.S. Appl. No. 10/391,094, parent application.
Lattice Semiconductor Corporation, "ORCA Series 4 FPGAs" datasheet, pp 1-6, 31-32, 39-48, and 57-74, Mar. 2003.

* cited by examiner

Primary Examiner—Patrick Wamsley

(57) ABSTRACT

A programmable logic device (PLD) with a programmable logic core, block memory, and I/O circuitry has one or more blocks of standard-cell logic (SLBs) that are integrated into the PLD design to enable each SLB to be programmably connected to any one or more of the programmable core, the block memory, and/or the I/O circuitry. The addition of standard-cell-based functional blocks creates a PLD with increased overall logic density, a net smaller die size per function, lowered cost, and improvements to both power and performance characteristics relative to equivalent conventional PLDs, such as FPGAs.

18 Claims, 13 Drawing Sheets

PROGRAMMABLE LOGIC DEVICES WITH INTEGRATED STANDARD-CELL LOGIC BLOCKS

RELATED APPLICATION DATA

This application is a continuation of application Ser. No. 10/391,094, filed Mar. 18, 2003, now U.S. Pat. No. 6,870,395.

TECHNICAL FIELD

The present invention relates to programmable logic devices, such as field programmable gate arrays.

BACKGROUND

Field programmable gate array (FPGA) technology offers the ability to implement and change user-designed logic with software programming of the device. This capability eliminates the mask and non-recurring engineering (NRE) costs associated with application-specific integrated circuit (ASIC) chip development and provides other benefits, like field programmability, which FPGA customers find advantageous.

One drawback for FPGA technology, however, is that it is far less efficient in silicon area than the standard-cell technology used in ASICs. Thus, a typical function implemented in an FPGA utilizes a larger silicon area and, consequently, higher unit costs that traditional ASICs. In particular, FPGA logic density can be from 50 to 100 times less efficient than the standard-cell logic commonly used for ASIC core logic.

In addition to the higher silicon area and associated costs, FPGA logic consumes more power and offers lower performance than ASIC logic. This results in FPGAs being suited primarily for low-volume applications and applications where changing industry standards can quickly obsolete a fixed ASIC.

SUMMARY

The problems in the prior art are addressed in accordance with the principles of the present invention by a programmable logic device, such as an FPGA, that includes one or more blocks of standard-cell logic, e.g., distributed around the periphery of the FPGA layout. As used in this specification, the term "standard-cell" refers to logic that is not software programmable after mask order. Thus, "standard-cell" refers to, for example, logic composed of standard-cells, full-custom circuits, all forms of gate array logic, and hybrids thereof, these being circuit types that are commonly used to implement ASIC core logic. Such logic, which typically has a much higher density than FPGA core logic, is not software programmable after mask order.

In one embodiment, a programmable logic device (PLD) of the present invention has a layout similar to a standard FPGA but with the addition of one or more standard-cell logic blocks (SLBs) positioned around the periphery of the device layout (i.e., the perimeter region often referred to as the "I/O ring") in locations that, in a conventional FPGA, are underutilized, such as at the four corners and on the sides adjacent to rows of block memory. In one implementation, each SLB is a relatively small block of standard-cell logic (e.g., under 500K gates). The addition of standard-cell-based functional blocks creates an FPGA hybrid with increased overall logic density, a net smaller die size per function, lowered cost, and improvements to both power and performance characteristics relative to an equivalent conventional FPGA.

According to certain embodiments, the present invention is a programmable logic device (PLD), comprising input/output (I/O) circuitry, programmable core logic, memory, one or more standard-cell logic blocks (SLBs), general routing resources, and SLB routing resources. The general routing resources provide programmable connections between the I/O circuitry, the programmable core logic, and the memory. The SLB routing resources provide programmable connections between (1) each SLB and (2) any of the I/O circuitry, the programmable core logic, and the memory. The SLB routing resources can be programmed to insert each SLB into a signal transfer path between (A) any of (i) the I/O circuitry, (ii) the programmable logic core, and (iii) the memory and (B) any of (i) the I/O circuitry, (ii) the programmable logic core, and (iii) the memory.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments.

Conventional FPGA Technology

Figure 1:
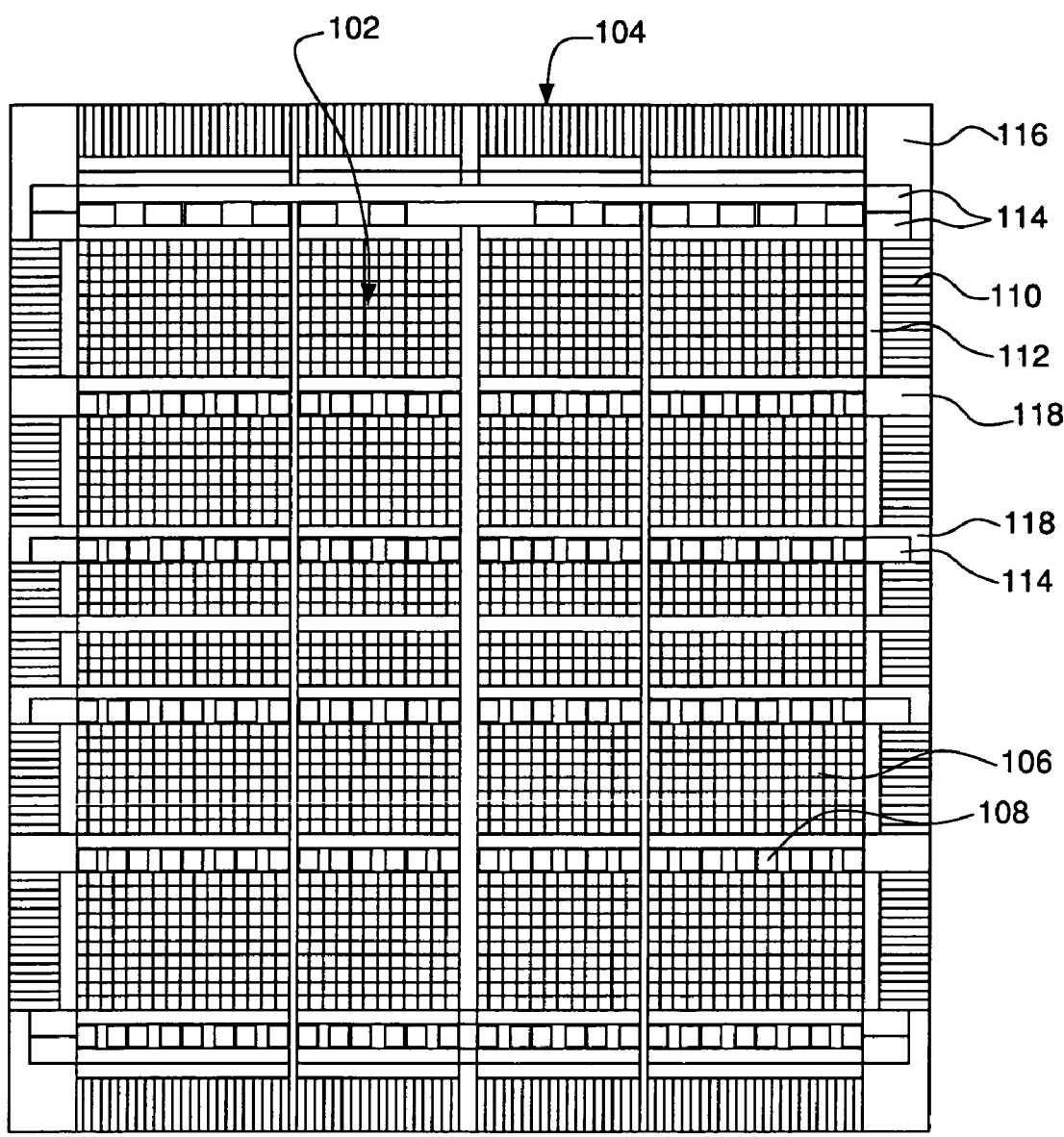
FIG. 1 shows a high-level block diagram of the layout of a conventional FPGA.

FIG. 1 shows a high-level block diagram of the layout of a conventional FPGA 100 having a logic core 102 surrounded by an input/output (I/O) ring 104. Logic core 102 includes an array of programmable logic blocks (PLBs) 106 intersected by rows of block memory 108. Each PLB contains circuitry that can be programmed to perform a variety of different functions. The memory blocks in each row are available to store data to be input to the PLBs and/or data generated by the PLBs. I/O ring 104 includes sets of I/O buffers 110 programmably connected to the logic core by mux/demux circuits 112. The I/O buffers support external interfacing to FPGA 100. In one implementation, I/O buffers 110 are implemented within programmable I/O circuits (PICs), each having three I/O buffers. Also located within the I/O ring are a number of phase-locked loop (PLL) circuits 114 that are capable of providing different timing signals for use by the various elements within FPGA 100. Those skilled in the art will understand that FPGAs, such as FPGA 100, will typically include other elements, such as configuration memory, that are not shown in the high-level block diagram of FIG. 1. In addition, general routing resources, including clocks, buses, general-purpose routing, high-speed routing, etc. (also not shown in FIG. 1), are provided throughout the FPGA layout to programmably interconnect the various elements within FPGA 100.

Like most conventional FPGAs, the layout of FPGA 100 includes a number of underutilized areas, many of which are located around the periphery of the device. These underutilized areas include regions 116 at the four corners of the device as well as regions 118 at the (left and right, in FIG. 1) sides of the device adjacent to the rows of block memory 108. Although these regions may include some circuitry, such as one or more PLL circuits, they also include areas with little or no circuitry.

Programmable Logic Device with Standard-Cell Logic Blocks

Figure 2:
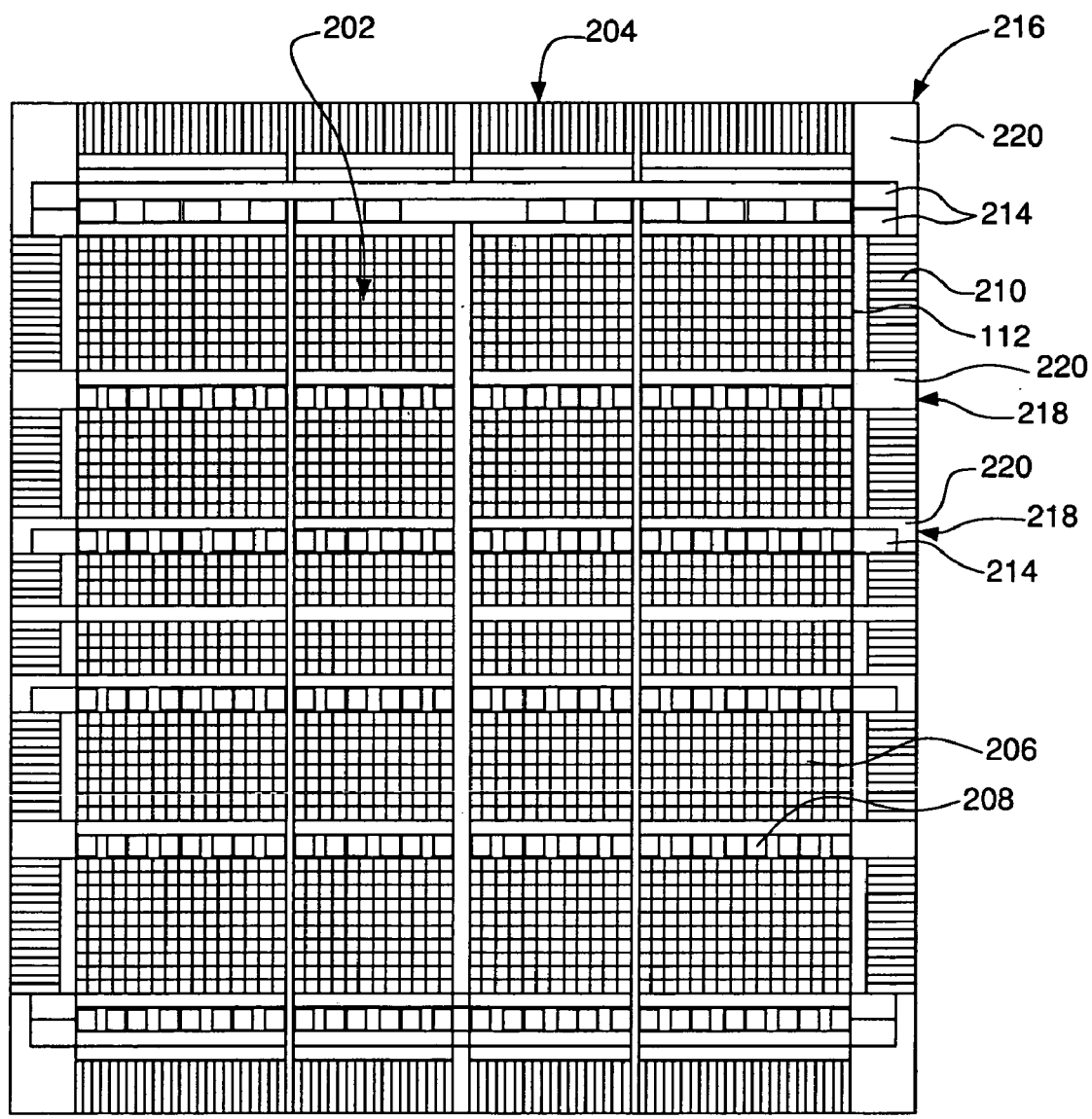
FIG. 2 shows a high-level block diagram of the layout of a programmable logic device (PLD), according to one embodiment of the present invention.

FIG. 2 shows a high-level block diagram of the layout of a programmable logic device (PLD) 200, according to one embodiment of the present invention. Similar to FPGA 100 of FIG. 1, PLD 200 has a logic core 202 surrounded by an I/O ring 204, where logic core 202 includes an array of programmable logic blocks 206 intersected by rows of block memory 208, and I/O ring 204 includes sets of I/O buffers 210 programmably connected to the logic core by mux/demux circuits 212 and a number of PLL circuits. In addition, however, PLD 200 includes a number of standard-cell logic blocks (SLBs) 220 located around the periphery of the device (i.e., within or proximate to the I/O ring) in regions that were underutilized in FPGA 100. In particular, PLD 200 includes one or more SLBs 220 in each region 216 located at the corner of the device as well as one or more SLBs 220 in each region 218 located at each (left or right, in FIG. 2) side of the device adjacent to each row of block memory 208.

In preferred implementations, regions 216 and 218 will typically have room for anywhere from about 25K up to about 500K SLB (e.g., ASIC-type) gates. For example, each region 216 located at a device corner has an area of approximately 3.0 $mm^2$ and may be able to support about 200K to about 500K SLB gates, while each region 218 located at a device side has an area of approximately 0.5 $mm^2$ and may be able to support about 25K to about 50K SLB gates, if the region also has a PLL circuit, and about 50K to about 100K SLB gates, if it does not. To put these numbers into context, the logic core of a conventional FPGA, such as FPGA 100 of FIG. 1, would typically provide the equivalent of about 250K standard-cell gates (not counting the block memory) if that same functionality were implemented in an ASIC.

As described previously, an SLB is a block of logic that is not software programmable after mask order. As such, an SLB is different from the PLBs located in a device's programmable logic core (e.g., core 102 of FPGA 100 of FIG. 1 or core 202 of PLD 200 of FIG. 2), since those PLBs are software programmable after mask order. In a preferred implementation, each SLB contains relatively small blocks (e.g., from about 5K up to about 500K SLB gates) of the same type of standard-cell logic used for the core logic of a typical ASIC device. Depending on the available area and the functionality to be supported, one or more different SLBs may be implemented within each region 216 or 218 in PLD 200. A typical implementation of PLD 200 may include anywhere from four to 20 different SLBs.

Although each region 216 and 218 of PLD 200 of FIG. 2 is completely filled, e.g., with SLB logic or with a combination of SLB logic and PLL circuitry, that is not necessarily true for all embodiments of the present invention. In general, PLDs of the present invention have one or more regions with SLB logic, where the SLB logic in each such region may correspond to one or more different SLBs, such regions may still have underutilized area, and each region having SLB logic may also have other circuitry such as PLL circuitry.

Even with one or more SLBs 220, I/O ring 204 of PLD 200 is still recognizable as I/O circuitry having sets of I/O buffers 210 separated by regions containing PLL circuits 214 and the SLBs. Although most of the area for the SLBs will typically correspond to unused layout in a conventional FPGA, such as FPGA 100 of FIG. 1, in some implementations of the present invention, one or more SLBs may occupy space otherwise used for PLL circuits, I/O buffers, or other I/O ring circuitry in conventional FPGAs. It is also possible for one or more SLBs to be implemented within the device's logic core in areas otherwise used for PLBs or memory blocks.

The physical layout of the standard-cell logic within each SLB 220 is preferably implemented using conventional standard-cell place-and-routing tools, methodology, and tool flows. The front end design of these functions is also preferably implemented using industry-standard tools and practices that currently apply to standard-cell logic design. Basically, each SLB is implemented as an independent, standard-cell-based block, which is then integrated into the PLD.

SLB Signal Connectivity

PLD 200 of FIG. 2 utilizes two connectivity structures to integrate the standard-cell gates of each SLB 220 with the rest of the device. The first connectivity structure is a perimeter-based structure that runs, e.g., over the I/O circuitry on an upper layer of metallization. This perimeter-based connectivity structure programmably connects each SLB to either I/O buffers, the programmable logic core, or both. The second connectivity structure is a core-based structure that runs, e.g., over the block memory on upper layers of metal. This core-based connectivity structure programmably connects each SLB to either memory blocks, the programmable logic core, or both. The regions of metal layers used in PLD 200 for these two connectivity structures correspond to regions of metal layers that are underutilized in typical FPGAs, such as FPGA 100 of FIG. 1.

Figure 3:
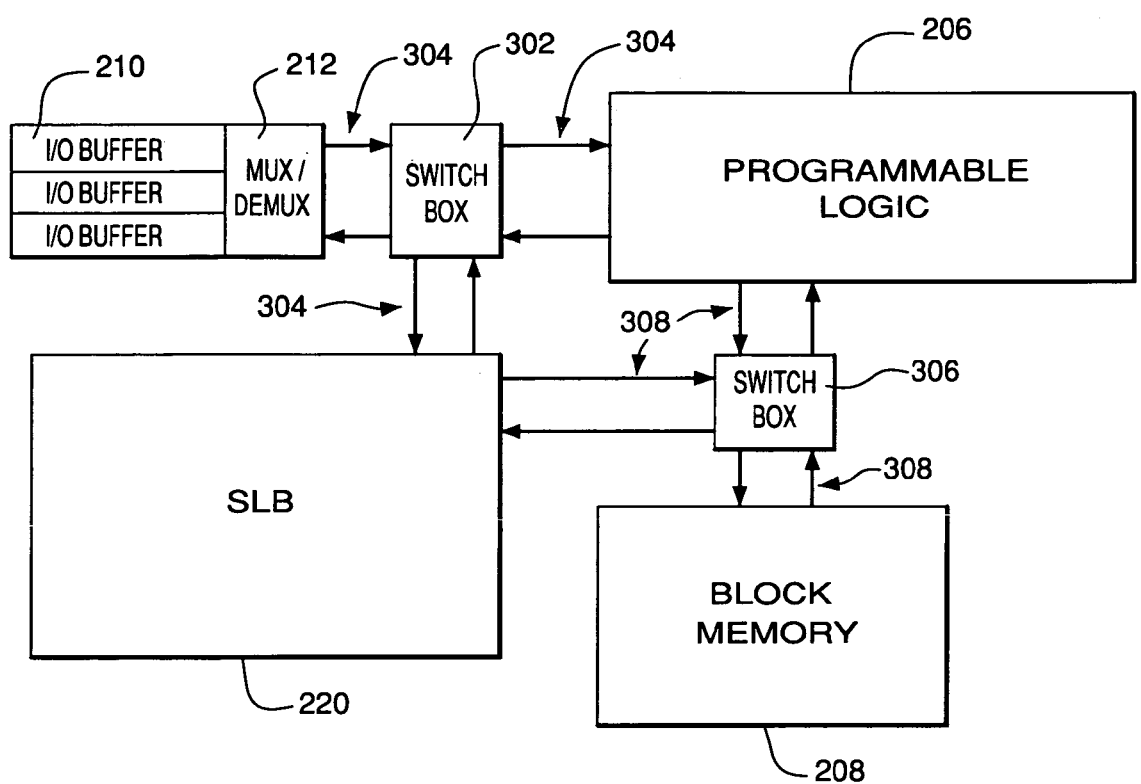
FIG. 3 shows a block diagram representing the possible interconnections between a particular standard-cell logic block (SLB) in the PLD of FIG. 2 and one or more I/O buffers, one or more programmable logic blocks (PLBs), and one or more memory blocks, according to one embodiment of the present invention.

FIG. 3 shows a block diagram representing the possible interconnections between a particular SLB 220 in PLD 200 of FIG. 2 and one or more I/O buffers 210, one or more PLBs 206, and one or more memory blocks 208, according to one embodiment of the present invention. As shown in FIG. 3, switch box 302 (e.g., a set of muxes) provides programmable connectivity via routing resources 304 between SLB 220, logic blocks 206, and muxes/demuxes 212 corresponding to I/O buffers 210. Switch box 302 and routing resources 304 form part of the first, perimeter-based connectivity structure of PLD 200. Similarly, switch box 306 (e.g., another set of muxes) provides programmable connectivity via routing resources 308 between SLB 220, logic blocks 206, and memory blocks 208. Switch box 306 and routing resources 308 form part of the second, core-based connectivity structure of PLD 200.

The muxes in switch boxes 302 and 306 are independently programmable to provide flexible connectivity between the various elements of PLD 200. In particular, switch boxes 302 and 306 can be programmed via software control to provide signal flow in a variety of ways between SLB 220 and the rest of PLD 200. Significantly, switch boxes 302 and 306 can also be programmed to bypass SLB 220 completely. According to this programmable configuration, switch box 302 is configured to provide connections between I/O buffers 210 and PLBs 206, while switch box 306 is configured to provide connections between memory blocks 208 and PLBs 206, with no connections provided to SLB 220. Note that, when configured with all of the SLBs 220 bypassed, PLD 200 will operate as a conventional FPGA.

In one possible implementation, each SLB 220 is connected to the rest of PLD 200 by 1,810 wires, which number should be sufficient for SLBs ranging from 5K to 500K gates. In other implementations, other numbers of wires can be used, including a single PLD having multiple SLBs, each with a different number of wires, e.g., depending on the size and/or functionality of the SLB.

Figure 4:
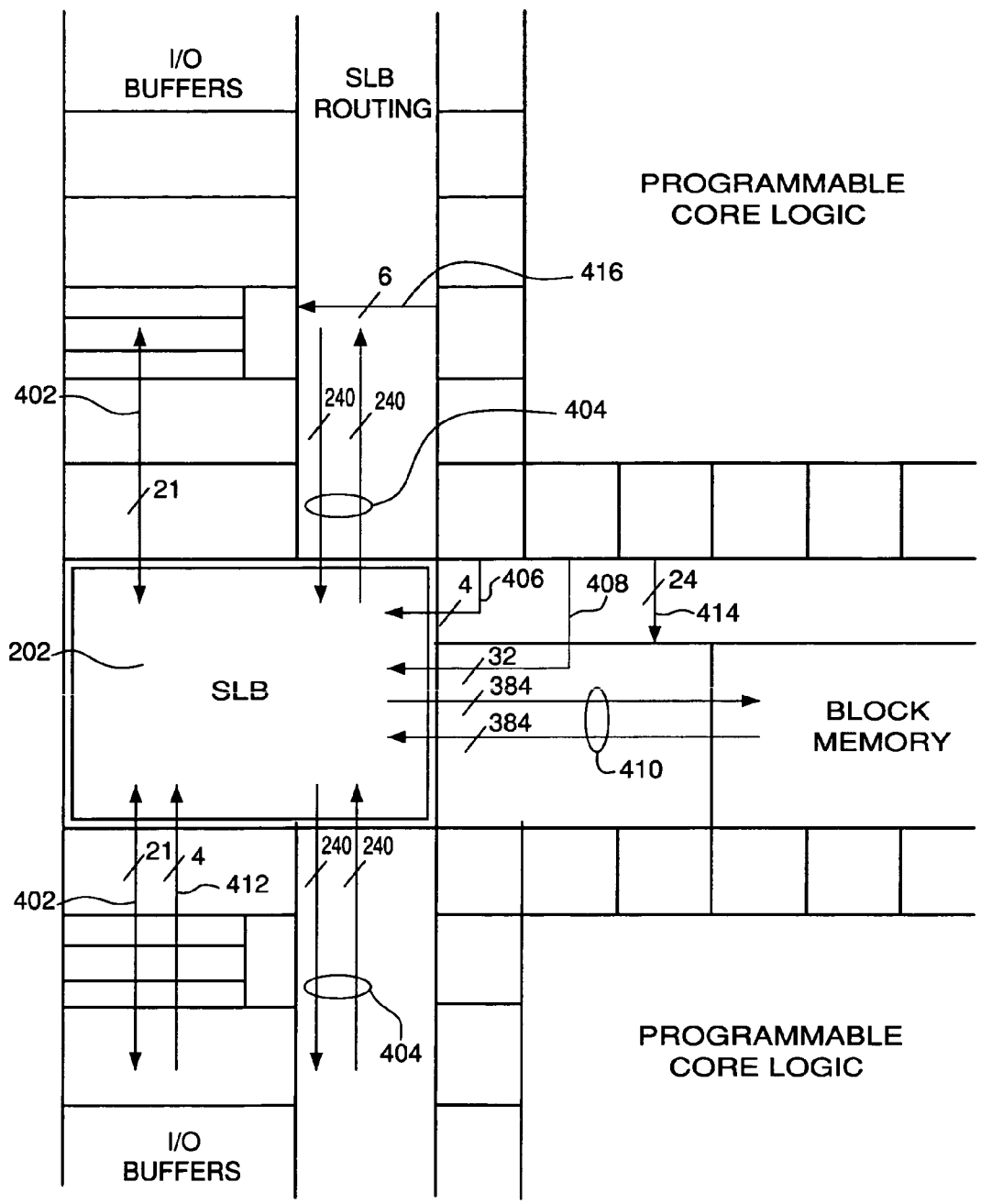
FIG. 4 represents the distribution of wires connecting a particular SLB of the PLD of FIG. 2 to the rest of the device, according to one embodiment of the present invention in which each SLB has 1,810 wires.

FIG. 4 represents the distribution of wires connecting a particular SLB 220 of PLD 200 of FIG. 2 to the rest of the device, according to one embodiment of the present invention in which each SLB has 1,810 wires. In particular, FIG. 4 shows wiring for 42 SLB perimeter control signals 402, 960 data signals 404 to or from I/O buffers and/or PLBs, 4 system clock signals 406, 32 control signals 408 from PLD configuration memory for the SLB, 768 data signals 410 to or from memory blocks and/or PLBs, and 4 edge clock signals 412. Each of the 1,810 wires terminates on one side of the SLB.

The 1006 wires for the 42 perimeter control signals 402, the 960 data signals 404, and the 4 edge clock signals 412 correspond to the first, perimeter-based connectivity structure of PLD 200, while the 804 wires for the 4 system clock signals 406, the 32 control signals 408, and the 768 data signals 410 correspond to the PLD's second, core-based connectivity structure.

The 960 data signals 404 are distributed over four sets of 240 unidirectional wires that drive or receive data to or from the SLB's top or bottom (as represented in FIG. 4), respectively. In one implementation, 10 of these wires are capable of transmitting signals to one of the accessible I/O buffers, and 10 wires are capable of receiving signals from that I/O buffer, where there are 3 I/O buffers per PIC (Programmable I/O Cell) and the wires rotate and repeat every 8 PICs, for a total of (3×8×10) or 240 wires in each set.

Figure 5:
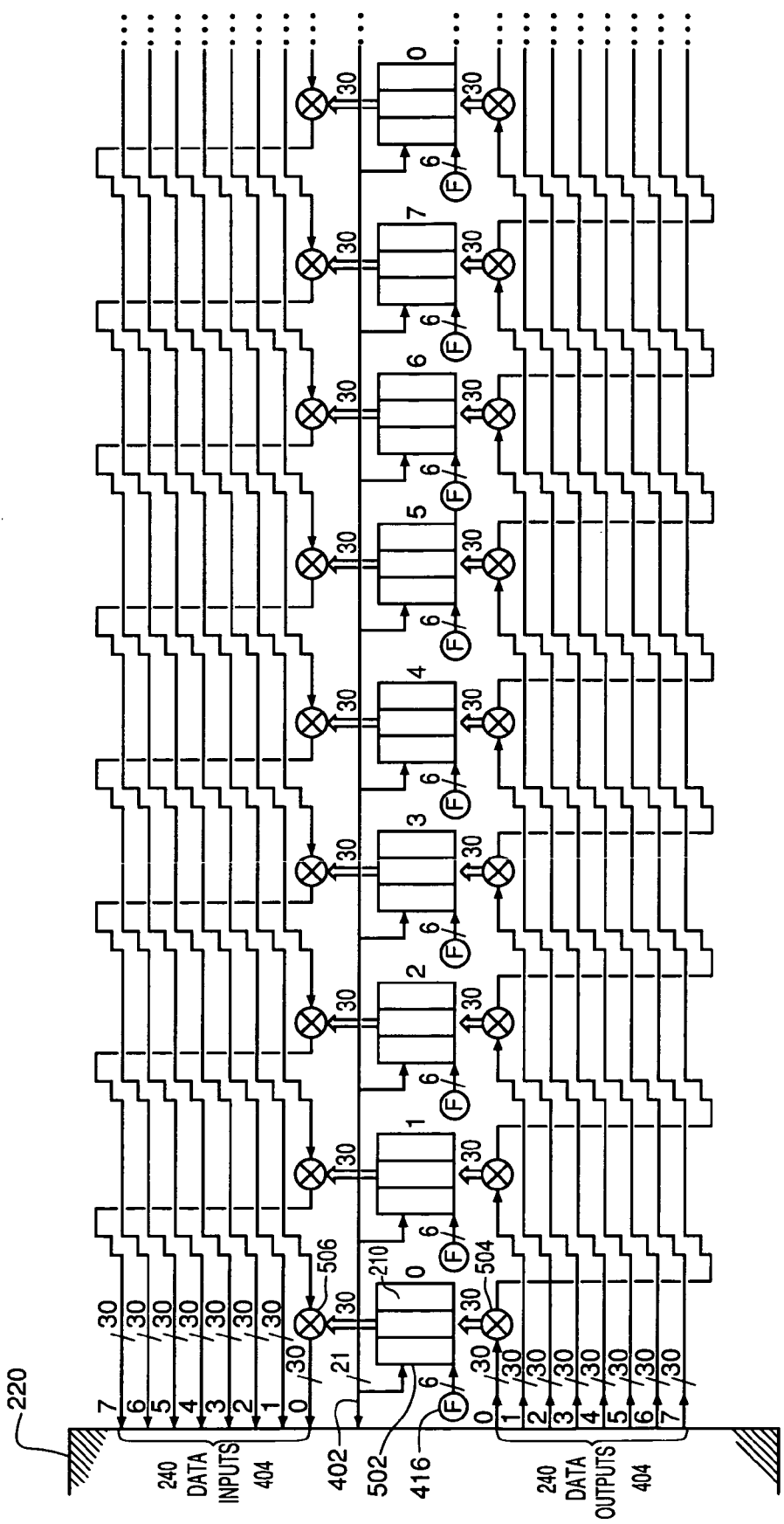
FIG. 5 represents the 8☐ wire rotation scheme for routing some of the data signals of FIG. 4.

FIG. 5 represents the 8× wire rotation scheme for routing half of the 960 data signals 404 of FIG. 4. In particular, FIG. 5 shows the wire rotation scheme for a set of 240 incoming data signals 404 and a set of 240 outgoing data signals 404 associated with either the top or bottom (as represented in FIG. 5) of the SLB in FIG. 4. FIG. 5 shows 9 PICs 502, each having 3 I/O buffers 210. Associated with each PIC 502 is an input mux 504 capable of selectively connecting the PIC to receive 30 output data signals 404 from the SLB and an output mux 506 capable of selectively connecting the PIC to drive 30 input data signals 404 to the SLB. Input and output muxes 504 and 506 form part of switch box 302 of FIG. 3.

As indicated in FIG. 5, the wiring associated with the $1^{st}$ PIC is also associated with the $9^{th}$ PIC, the $17^{th}$ PIC, etc. Similarly, the wiring associated with the $2^{nd}$ PIC is also associated with the $10^{th}$ PIC, the $18^{th}$ PIC, etc., and so on for the $3^{rd}$ through $8^{th}$ PICs. The 6 local control signals 416 of FIG. 4 source from PLD configuration memory to control muxes 504 and 506 to determine which PICs are accessed by the SLB. Alternatively, 21 control signals 402 of FIG. 4 sourced from the SLB can be selected to control muxes 504 and 506. The specific number of wires used, the repeat/buffer pattern, whether the wires are unidirectional or bidirectional, and the number of wires per I/O buffer are design choices that may be based on the specific SLB application.

The perimeter routing structure preferably runs continuously around the device terminating at each SLB encountered. This creates a daisy-chain structure of perimeter routes and SLB blocks. Each SLB contains muxes that selectively enable the perimeter routing to continue through, i.e., bypass, that SLB. The SLB muxes are controlled by the 32 control signals 408 of FIG. 4. The resulting repeat-and-buffer pattern of the perimeter routing is continuous so that a specific SLB could, in theory, drive an I/O buffer anywhere on the device with all intervening SLBs programmed in bypass mode.

The combination of perimeter routing, I/O buffers, switch muxes, SLBs, and configuration memory provides a very flexible routing structure that can implement many different topologies. As described above, SLBs are not limited to accessing only their adjacent I/O buffers, but can access I/O some distance away. The perimeter routing could be used to connect one SLB to another SLB if so desired.

Referring again to FIG. 4, the 768 data signals 410 are distributed over two sets of 384 unidirectional wires that drive or receive data to or from one side of the SLB (the right side for the SLB represented in FIG. 4), respectively. In one implementation, 64 of these wires are capable of transmitting signals to one of the accessible memory blocks, and 64 wires are capable of receiving signals from that memory block, where the wires rotate and repeat every 6 memory blocks, for a total of (6×64) or 384 wires in each set.

Figure 6:
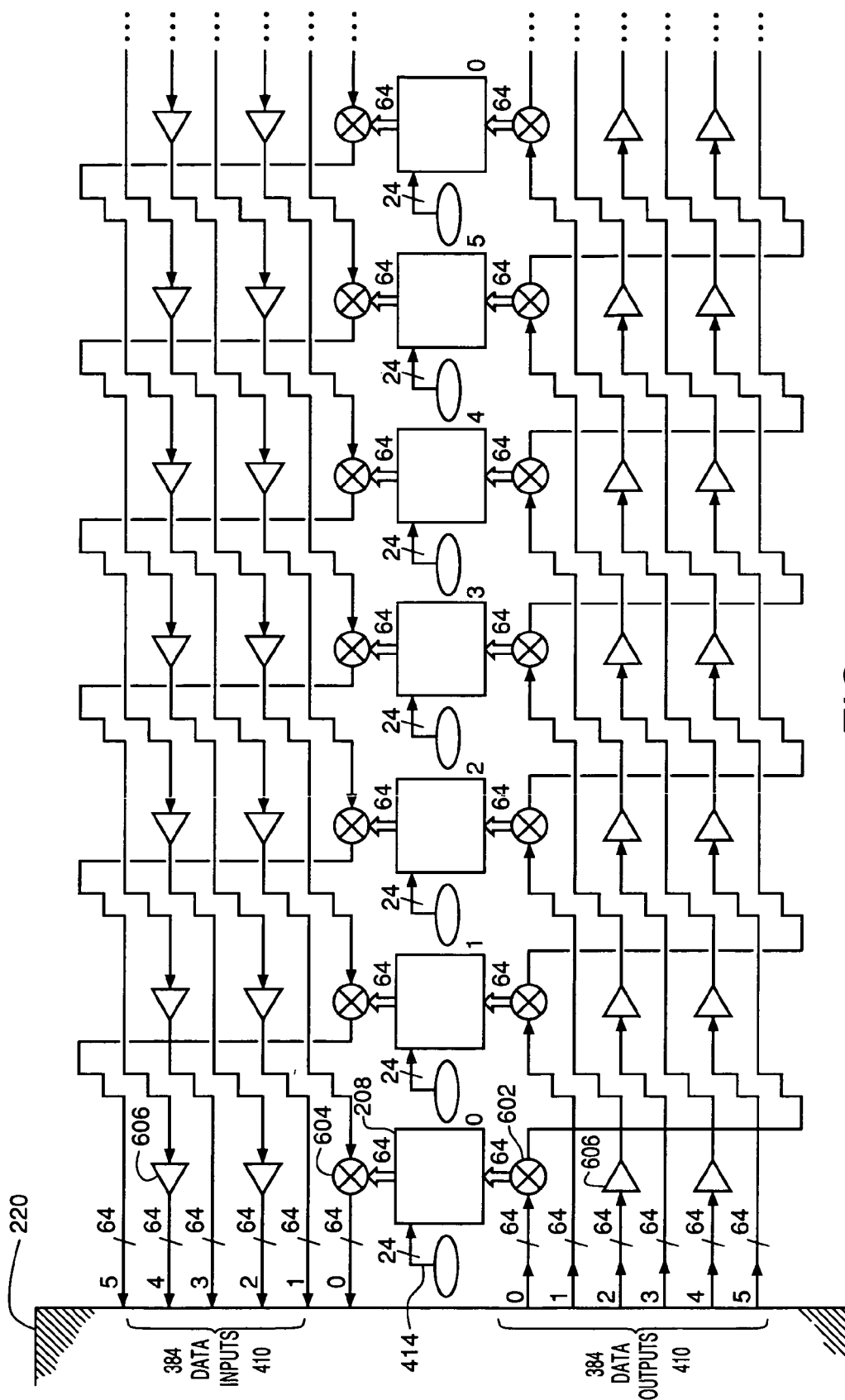
FIG. 6 represents the 6☐ wire rotation scheme for routing other data signals of FIG. 4.

FIG. 6 represents the 6× wire rotation scheme for routing the 384 incoming and 384 outgoing data signals 410 of FIG. 4. FIG. 6 shows 7 memory blocks 208. Associated with each memory block 208 is an input mux 602 capable of selectively connecting the memory block to receive 64 output data signals 410 from the SLB and an output mux 604 capable of selectively connecting the memory block to drive 64 input data signals 410 to the SLB. Input and output muxes 602 and 604 form part of switch box 306 of FIG. 3. FIG. 6 also shows signal buffers 606 used to periodically buffer each set of 64 data signals 410.

As indicated in FIG. 6, the wiring associated with the $1^{st}$ memory block is also associated with the $7^{th}$ memory block, the $13^{th}$ memory block, etc. Similarly, the wiring associated with the $2^{nd}$ memory block is also associated with the $8^{th}$ memory block, the $14^{th}$ memory block, etc., and so on for the $3^{rd}$ through $6^{th}$ memory blocks. The 24 local control signals 414 of FIG. 4 source from PLD configuration memory to control muxes 602 and 604 to determine which memory blocks are accessed by the SLB, while additional configuration memory control signals control the configuration of each memory block. In one implementation, all wires terminate after 6 memory blocks. For example, the set of wires that correspond to the $1^{st}$ memory block terminates at the $1^{st}$ memory block, the set of wires that correspond to the $2^{nd}$ memory block terminates at the $2^{nd}$ memory block, and likewise until the final set terminates at the $6^{th}$ memory block. The decision to make these wires terminate after 6 memory blocks is design-specific. In theory, they could continue across the entire chip, if deemed necessary. Moreover, the specific number of wires used, the repeat/buffer pattern, whether the wires are unidirectional or bidirectional, and the number of wires per memory block are design choices that may be based on the specific SLB application.

Referring again to FIG. 4, the 32 incoming control signals 408 for the SLB are sourced from PLD configuration memory (not shown), while the 42 SLB perimeter control signals 402 control the perimeter routing muxes (e.g., muxes 504 and 506 in FIG. 5). Control wires can source from the SLB itself or by means of configuration memory (not shown) local to the memory blocks and I/O buffers or a combination of these. The decision is design-specific. The 4 system clocks 406 and 4 edge clocks 412 provide up to 8 different clock signals for the SLB.

SLBs located in the corners of the PLD (where no corresponding rows of block memory exist) will lack the core-based connectivity structures (i.e., 306 and 308 of FIG. 3 and 410 of FIG. 4), but will have access to the perimeter-based connectivity structures (i.e., 302 and 304 of FIG. 3 and 402 and 404 of FIG. 4), edge clocks 412, and system clocks 406.

The SLB connectivity scheme of PLD 200 employed for signal flow between the various PLD elements very closely couples the SLBs to the I/O buffers, the memory blocks, and the PLD programmable logic core. This results in blocks of high-density standard-cell logic tightly integrated into the PLD system such that data can flow seamlessly to and from the SLBs in a variety of ways under software control.

Configurations for Data Insertion

This section describes one specific implementation of the muxes in switch boxes 302 and 306 of FIG. 3. Modifications, derivatives, and other types of switch-box connectivity can be implemented by one skilled in the art depending on the specific design application. The present example is illustrative of one application but other examples also apply. In general, switch boxes 302 and 306 enable a variety of SLB blocks to drive or access data flow between I/O buffers, memory blocks, and the PLD programmable core. The switch boxes also enable continuous data flow along certain paths, e.g., around the perimeter of the device and across rows of block memory.

Figure 7:
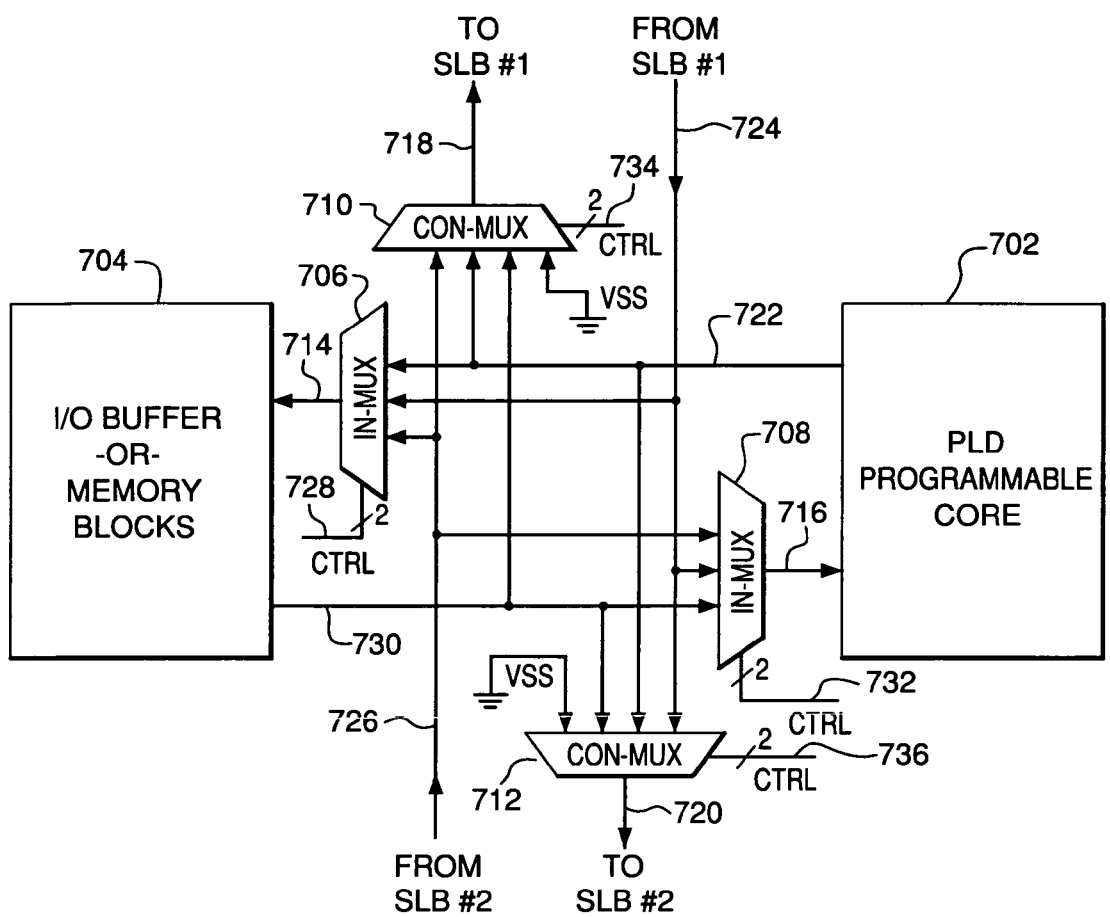
FIG. 7 represents the muxes and connections used to selectively connect SLBs to other elements in the PLD of FIG. 2, according to one embodiment of the present invention.

FIG. 7 represents the muxes and connections used to selectively connect SLBs 220 to other elements in PLD 200 of FIG. 2, according to one embodiment of the present invention. As indicated in FIG. 7, the represented muxes and connections may be used to selectively connect two SLBs (referred to as SLB #1 and SLB #2) to the PLD's programmable core 702 via routing 722 and 716 and/or to either I/O buffers or memory blocks, represented generically by block 704. When designed to selectively connect an SLB to programmable core logic and/or I/O buffers, then the muxes and connections shown in FIG. 7 may be said to correspond to SLB switch box 302 and routing resources 304 of FIG. 3. On the other hand, when designed to selectively connect an SLB to programmable core logic and/or block memory, then the muxes and connections shown in FIG. 7 may be said to correspond to SLB switch box 306 and routing resources 308 of FIG. 3.

Two types of muxes are represented in FIG. 7: insertion muxes (in-muxes) 706 and 708 and continuation muxes (con-muxes) 710 and 712 Insertion mux 706 permits the insertion of data, e.g., from either one of the two SLBs, to block 704 via routing 714, while insertion mux 708 permits the insertion of data, e.g., from either one of the two SLBs, to programmable core 702 via routing 716. Continuation mux 710 allows data to flow to SLB #1, while continuation mux 712 allows data to flow to SLB #2.

More particularly, insertion mux 706 is connected to receive signals from programmable core 702 via connection 722, from SLB #1 via connection 724, and from SLB #2 via connection 726, where mux 706 selects one of the received signals based on control signals 728 provided by PLD configuration memory or by means of SLB control signals 402 of FIG. 4. The output from insertion mux 706 is applied to block 704 via connection 714.

Similarly, insertion mux 708 is connected to receive signals from block 704 via connection 730, from SLB #1 via connection 724, and from SLB #2 via connection 726, where mux 708 selects one of the received signals based on control signals 732 provided by PLD configuration memory or by means of SLB control signals 402 of FIG. 4. The output from insertion mux 708 is applied to programmable core 702 via connection 716.

Continuation mux 710 is connected to receive signals from programmable core 702 via connection 722, from block 704 via connection 730, from SLB #2 via connection 726, and from voltage source VSS (e.g., ground), where mux 710 selects one of the received signals based on control signals 734 provided by PLD configuration memory or by means of SLB control signals 402 of FIG. 4. The output from continuation mux 710 is applied to SLB #1 via connection 718.

Similarly, continuation mux 712 is connected to receive signals from programmable core 702 via connection 722, from block 704 via connection 730, from SLB #1 via connection 724, and from voltage source VSS, where mux 712 selects one of the received signals based on control signals 736 provided by PLD configuration memory or by means of SLB control signals 402 of FIG. 4. The output from continuation mux 712 is applied to SLB #2 via connection 720.

In order to drive data from programmable core 702 via routing 722 to block 704 (e.g., to a memory block or an I/O buffer), control signals 728 is set to cause mux 706 to select connection 722 to drive connection 714. In order to drive data from SLB #1 to block 704, control signals 728 is set to cause mux 706 to select connection 724 as its active input instead of connection 722. Similarly, in order to drive data from SLB #2 to block 704, control signals 728 is set to cause mux 706 to select connection 726 as its active input. Note that, in this implementation, block 704 can be driven by only one device at a time (i.e., either programmable core 702 or SLB #1 or SLB #2). This limitation is not necessarily true for all possible implementations.

In an analogous manner, each of muxes 708, 710, and 712 can be controlled to selectively drive one of its received signals to programmable core 702, SLBs #1, and #2, respectively. In a preferred implementation, default operation has muxes 710 and 712 selecting VSS as their active inputs in order to ground connections 718 and 720, which in turn preferably causes connections 724 and 726 to be grounded due to their complementary relationship. Similarly, default operation preferably has muxes 706 and 708 selecting connections 722 and 730, respectively, as their active inputs. In this way, default operation bypasses the SLBs.

In one possible configuration, mux 710 drives data from one or more I/O buffers (i.e., block 704) to SLB #1 via connections 730 and 718, where the incoming data is processed by SLB #1 and then output from SLB #1 to programmable core 702 via connections 724 and 716 by appropriately configuring mux 708. With such a configuration, SLB-based logic can be inserted between the I/O buffers and the PLD's programmable core to implement an I/O input interface function using standard-cell logic.

Alternatively, a reverse flow can be configured in order to insert SLB-based logic between the PLD's programmable core and one or more I/O buffers to implement an I/O output interface function. In particular, mux 710 can be configured to drive outgoing data from programmable core 702 to SLB #1 via connections 722 and 718, where SLB #1 processes and then outputs the outgoing data from SLB #1 to the I/O buffers (i.e., block 704) via connections 724 and 714 by appropriately configuring mux 706.

Analogous configurations are possible for SLB #2. In general, each of muxes 706–712 can be controlled independently to provide a wide range of possible configurations between SLBs #1 and #2 and their associated I/O buffers, memory blocks, and PLBs, including configurations where one or both SLBs are completely bypassed.

Because the present invention tightly integrates standard-cell blocks to the I/O buffers and programmable core, an SLB can be efficiently used to build a variety of high-capacity, I/O interface protocols. A few exemplary interfaces include those conforming to the HyperTransport, RapidIO, PCI-X, SPI-4, SFI-4, and PL-3 industry standards. For interface applications, the SLB can use conventional I/O buffers to implement the physical signaling for the interface. The mux/demux functions may be implemented by the SLB itself or by elements contained in or associated with the I/O buffers. The link layer and management control functions are preferably implemented in the SLB possibly using the PLD's block memory. Any additional features may be performed by the PLD's programmable core.

Implementing the link and control functions of the I/O interface with standard-cell logic saves the customer from having to develop, debug, and use the PLD's limited programmable logic resources for these functions. This implementation also saves significant silicon area and delivers higher system performance. The result is a fully featured I/O interface instantly usable by the customer and for delivering fully realized, "hard IP" (intellectual property) blocks for I/O interfaces in a PLD. SLBs are not limited to I/O interfaces and can be used to integrate many forms of data path processing engines into the PLD, such as a media access controller (MAC). A given SLB can be designed to provide multiple functions (e.g., interface functions corresponding to two or more different industry standards) that can be selected by the customer by means of configuration memory and connections DO of FIG. 4.

Configurations for Data Continuation

Referring still to FIG. 7, in addition to driving data to SLBs #1 and #2, continuation muxes 710 and 712 of FIG. 7 can also be used to support the driving of data around the perimeter (i.e., to and from elements beyond SLBs #1 and #2) without affecting normal PLD core or I/O behavior at that site. For example, if mux 710 is configured to select connection 726 to drive connection 718, then data from SLB #2 will be driven to SLB #1. This capability enables SLB data to pass or continue along the perimeter of PLD until is reaches a desired destination (e.g., a particular I/O buffer) This allows each SLB to connect to a more distant I/O buffer, e.g., to avoid PLD congestion, to skip past unbonded I/O buffers, and/or make other adjustments to the final IP pinout of the PLD, if needed. Muxes 710 and 712 also provide points where signals can be buffered for purposes of signal integrity.

Exemplary SLB Configurations

Figure 8:
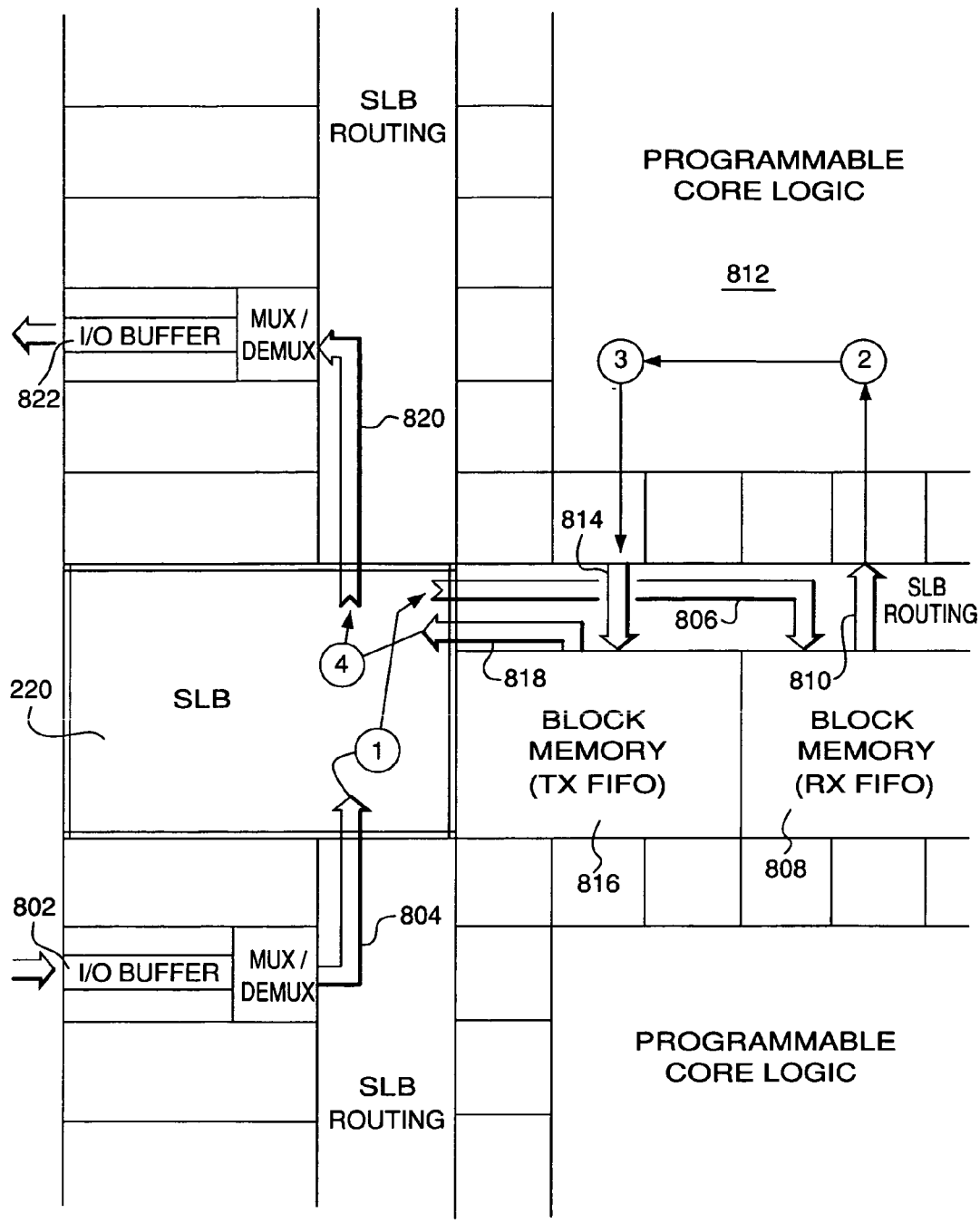
FIGS. 8–10 illustrate three exemplary types of configurations for an SLB of the PLD of FIG. 2.
Figure 9:
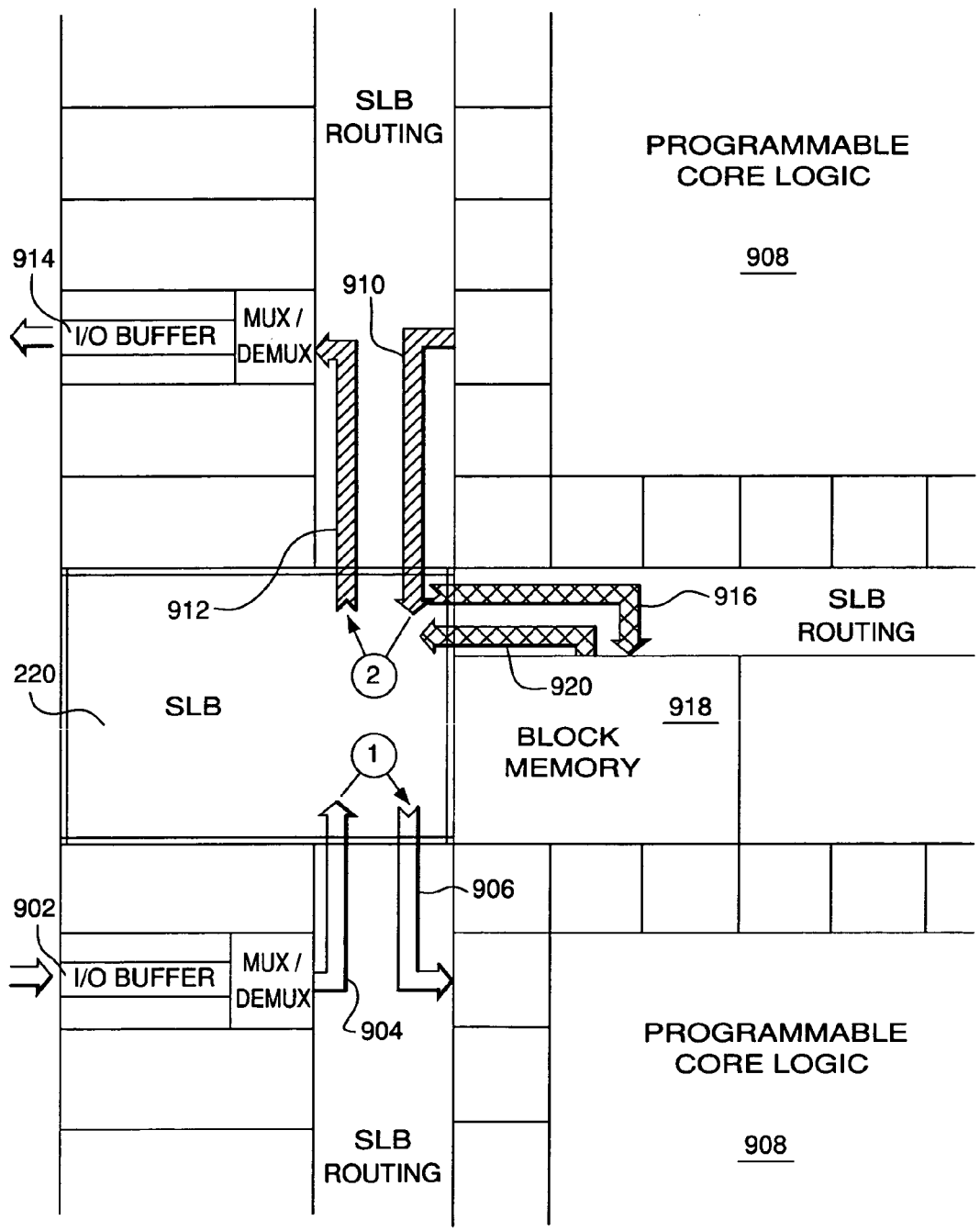
Figure 10:
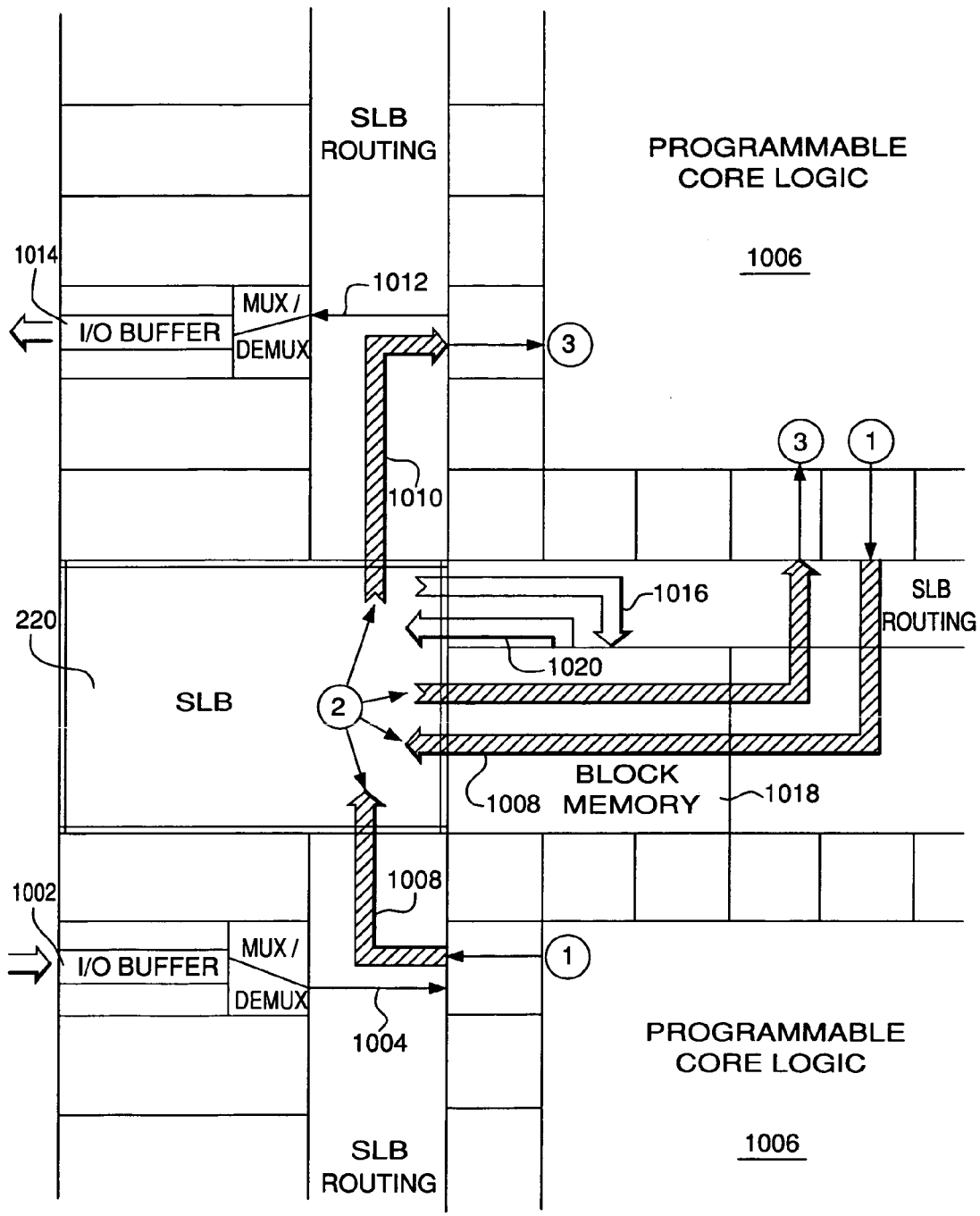

FIGS. 8–10 illustrate three exemplary types of configurations for an SLB 220 of PLD 200 of FIG. 2. Other types of configurations are also possible. FIG. 8 shows SLB 220 inserted between the I/O ring and the PLD's block memory, FIG. 9 shows SLB 220 inserted between the I/O ring and the PLD's programmable core, and FIG. 10 shows SLB 220 configured as an internal processing engine that assists operations of the PLD core.

In particular, in the configuration type of FIG. 8, externally generated data is received at I/O ports 802 and routed via path 804 to SLB 220, where the data is processed and then stored via path 806 to memory blocks 808. The PLD's programmable core logic 812 accesses the SLB-processed data from memory blocks 808 via path 810 and further processes the data, which is then stored via path 814 to memory blocks 816. SLB 220 accesses the core-processed data from memory blocks 816 via path 818, further processes the data, and transmits the processed data via path 220 to I/O buffers 822 for access by the outside world.

In one particular configuration of the type of FIG. 8, each of 16 input buffers 802 receives incoming data at 800 Mbits per second (Mbps) for a total input data rate of 12.8 Gbits per second (Gbps), which is input to SLB 220. Similarly, 12.8 Gbps of output data are evenly distributed as 800-Mbps outgoing data signals to 16 output buffers 822. When implemented with about 100K gates, in such a configuration, SLB 220 can operate as a link layer that supports an I/O interface conforming to the SPI-4 industry standard.

In the configuration type of FIG. 9, externally generated data is received at I/O ports 902 and routed via path 904 to SLB 220, where the data is processed and then transmitted via path 906 directly to the PLD programmable logic core 908. Meanwhile, processed data from programmable core 908 is transmitted via path 910 to SLB 220, where the data is further processed and transmitted via path 912 to I/O buffers 914 for access by the outside world. Note that, during SLB data processing, SLB 220 may use one or more memory blocks 918 for temporary data storage via paths 916 and 920.

In one particular configuration of the type of FIG. 9, each of 32 input buffers 902 receives incoming data at 212 Mbits per second (Mbps) for a total input data rate of 6.8 Gbps, which is input to SLB 220. Similarly, 6.8 Gbps of output data are evenly distributed as 212-Mbps outgoing data signals to 32 output buffers 914. When implemented with about 20K gates, in such a configuration, SLB 220 can operate as a controller layer for a QDRAM interface.

In the configuration type of FIG. 10, externally generated data is received at I/O ports 1002 and routed via path 1004 to the PLD programmable logic core 1006 without relying on SLB 220. Meanwhile, processed data from logic core 1006 is transmitted via path 1008 to SLB 220, where the data is further processed and then transmitted via path 1010 back to logic core 1006, where it is further processed and ultimately transmitted via path 1012 to I/O buffers 1014 for access by the outside world. Note that, as in the configuration of FIG. 9, during SLB data processing, SLB 220 may use one or more memory blocks 1018 for temporary data storage via paths 1016 and 1020.

When implemented with about 160K gates, in a configuration of the type of FIG. 10, SLB 220 can operate as a media access controller (MAC) that can provide dedicated data processing for customer applications. Another useful application is for SLB 220 to perform video codec processing to compress and/or decompress encoded video bitstreams. These are examples of SLBs performing data path engine functionality as compared with the previous examples in which the SLBs implemented standard I/O interfaces.

SLB Control

Control signals can source from either the SLB itself or from local configuration memory. In one implementation, two sets of 10 control wires and a select source from each side of each SLB for a total of 42 wires (402 in FIG. 4). These are bidirectional lines that can be driven by either SLB sharing the lines (e.g., SLB #1 and SLB #2 in FIG. 7). These signals can control routing muxes 706–712 of FIG. 7, which reduces the need for configuration memory. Another bidirectional control signal is used to select which of the two sets of control signals is active. Local configuration bits can be set to override the global controls in order to restore default operation. Local control can also activate an operational mode that splits control between such global sets. It is also possible to control routing muxes 706–712 entirely from local configuration memory, if desired.

The SLB control scheme enables the I/O buffers to be partitioned between SLBs such that some may be used to I/O transmit gates, others may be used as I/O receive gates, unbonded I/O buffers can be skipped, and still other I/O buffers may be used for "conventional FPGA" operations that are independent of SLBs. Configuring I/O buffers for conventional FPGA operations makes PLDs of the present invention efficient for package pinout, because entire groups of I/O buffers do not have to be consumed all together by an SLB, but rather can be allocated on a pin-by-pin basis and specific to a customer's application. Skipping unbonded pins is an important feature, because skipping pins is frequently necessary to meet packaging requirements.

The SLB control scheme also permits I/O density to be spread or concentrated to match the needs of a particular application. For instance, industry standards for I/O interfaces like XGMII or SPI-4 tend to use relatively few I/O ports that run at relatively high frequencies and use DDR (Double Data Rate). For example, as shown in FIG. 8, SPI-4 uses 16 I/O ports for data, each running at 800 Mbps (400 MHz, DDR) to achieve a 12.8-Gbps total bandwidth. On the other hand, as shown in FIG. 9, a QDRAM interface may drive 32 I/O ports at 106 MHz, DDR, to achieve a bandwidth of 6.8 Gbps. Thus, some applications concentrate bandwidth onto relatively few I/O ports, while others spread the bandwidth across more I/O ports. PLDs of the present invention have the ability to concentrate or spread data signals to the I/O buffers to match the needs of the specific application.

Returning to the SPI-4 application of FIG. 8, which drives relatively few I/O ports at relatively high data rates, the mux/demux functions built into the I/O buffer logic are fed with 4 to 8 lower rate signals. On the other hand, since the QDRAM application of FIG. 9 drives more I/O ports at a lower rate, only two signals need to be fed to the mux/demux structures. In the implementation of FIG. 4, where two signals are preferably used for synchronization and eight signals are used for data transfer, SLB 220 can send a maximum of 10 signals to any individual I/O buffer per direction, which corresponds to an 8× mux or demux ratio.

As such, SLB 220 can send a maximum density of 8 signal to each mux/demux block and concentrate the I/O across 24 I/O buffers (i.e., 240 wires with 10 wires per I/O buffer). At the opposite extreme, the same 240 data signals can be spread out by delivering only 2 signals to each of 120 different I/O buffers. Including the possible intermediate configurations, PLDs of the present invention can be used either to concentrate or spread out the I/O to meet specific interface needs.

Figure 11:
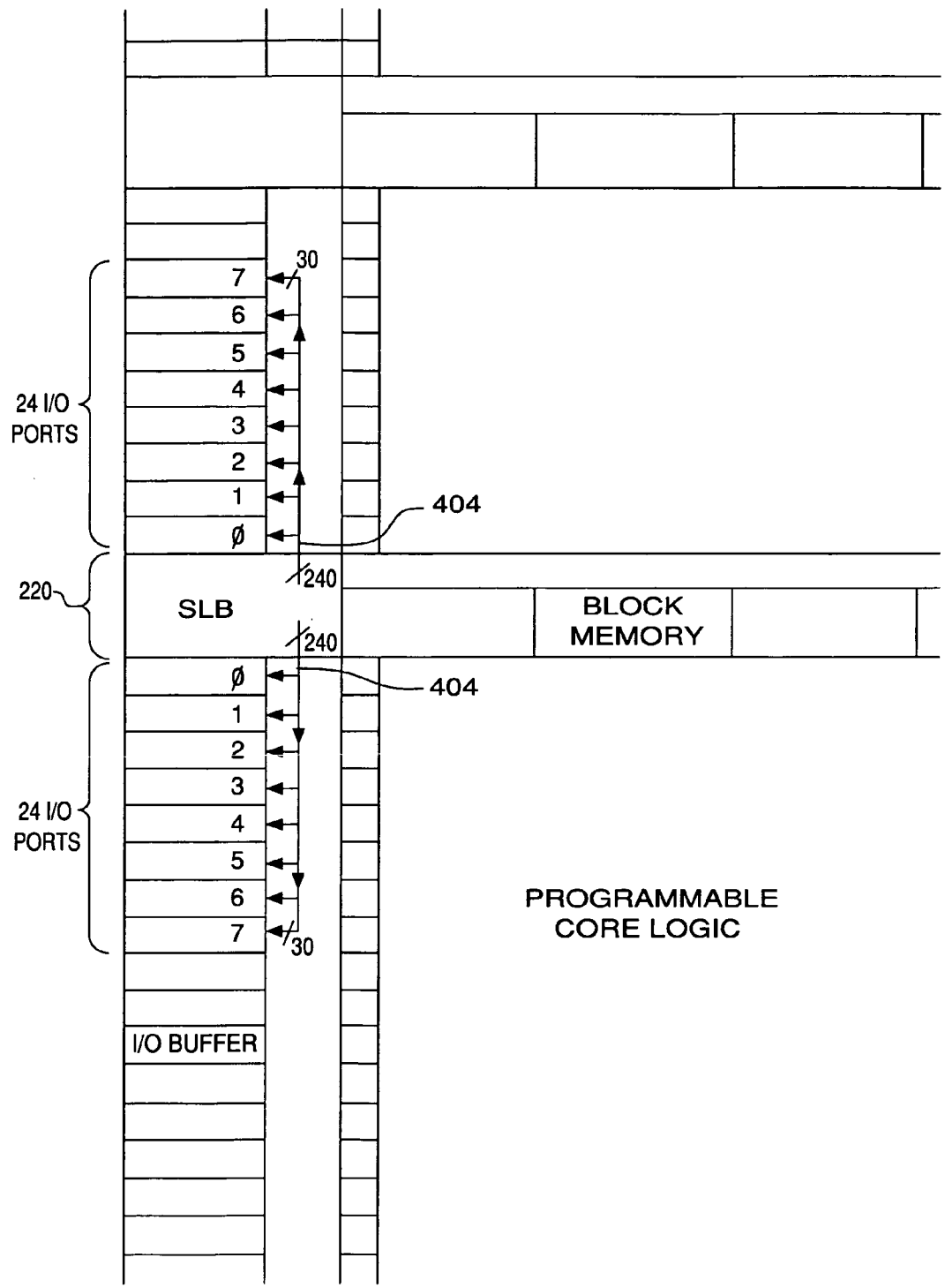
FIGS. 11–13 illustrate three exemplary I/O configurations for the PLD of FIG. 1 for a given SLB for different applications highlighting the flexibility of the control scheme of the present invention.
Figure 12:
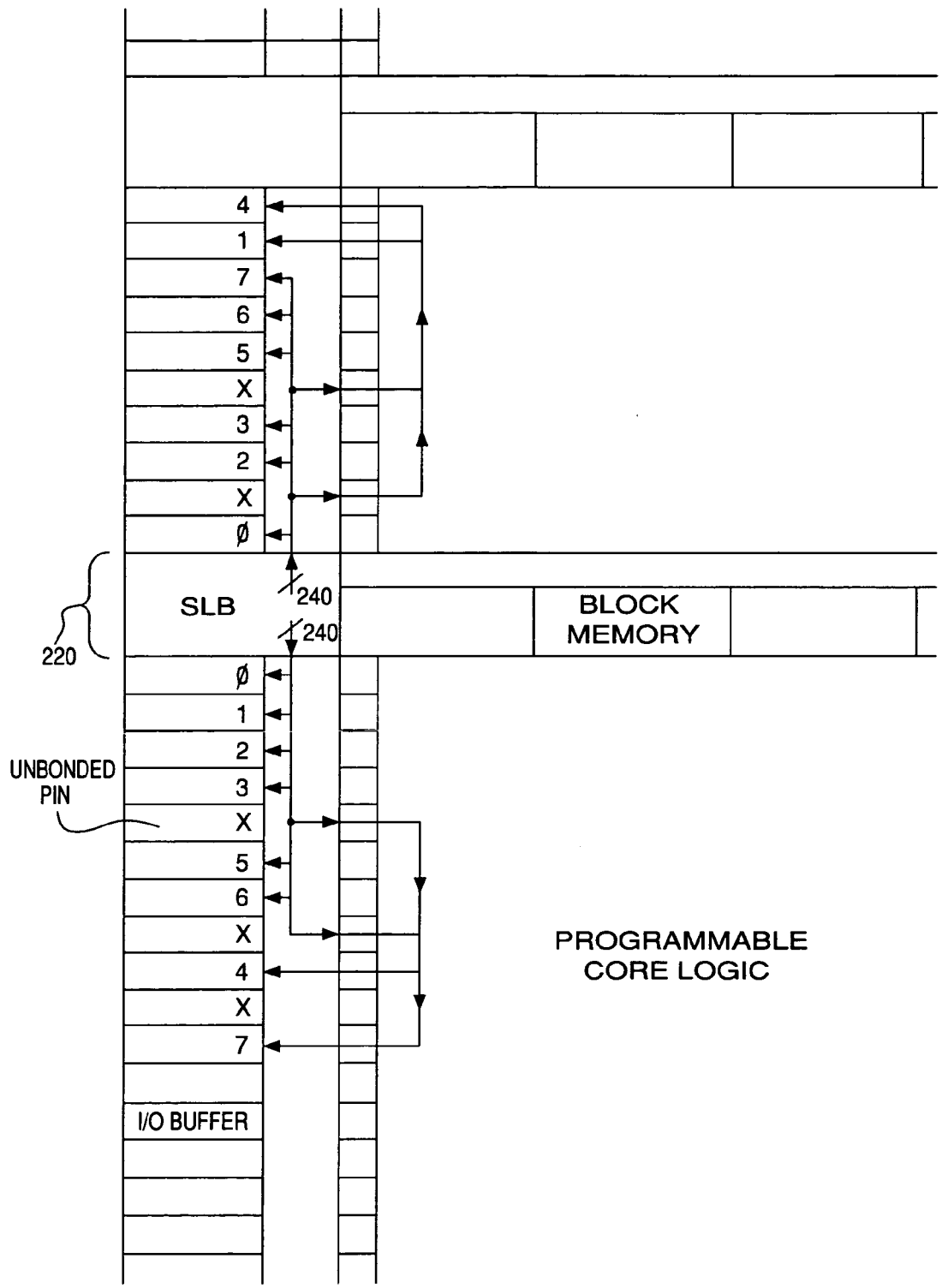
Figure 13:
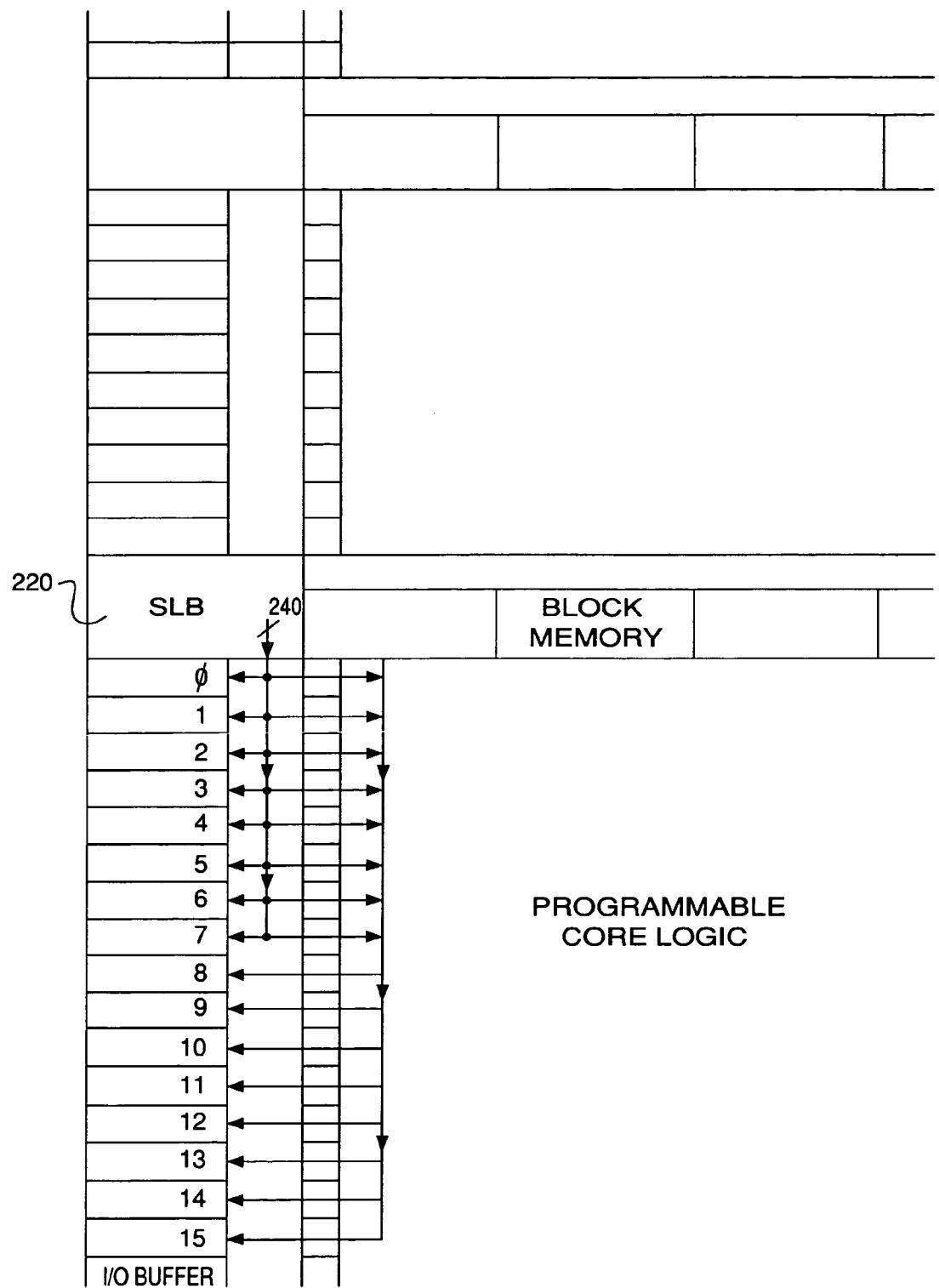

FIGS. 11–13 illustrate three exemplary I/O configurations for PLD 200 of FIG. 2 for a given SLB 220 for different applications highlighting the flexibility of the control scheme of the present invention. These examples demonstrate the ability of the routing resources to be programmed to provide an SLB with I/O resources having a footprint, whose degree of concentration/distribution is consistent with the requirements of the customer's application.

According to the configuration of FIG. 11, the two sets of 240 outgoing data signals 404 are used to drive 24 consecutive I/O ports on either side of SLB 220, where each mux is driven at 4×, DDR, for 10 pins per I/O buffer, 30 pins per PIC, and 240 pins per 8 PICs.

According to the configuration of FIG. 12, the general routing resources of the PLD are used to bypass unbonded I/O ports. According to the configuration of FIG. 13, the PLD's general routing resources are used to spread the SLB data signals over more than 8 PICs. In this case, half the SLB data drive the first set of 24 I/O buffers (PICs 0 to 7) directly, while the other half are re-directed to the PLD core by the routing muxes of switch box 302 of FIG. 3 before being returned to the second set of 24 I/O buffers (PICs 8 to 15). This configuration can be extended to provide greater signal division and I/O spreading (e.g., 4×, 8×, etc.) with potential bypassing of unbonded I/O ports.

In these two latter configurations, the PLD core itself is used as a general switch box and router to support the SLB distribution needs. An alternative solution would be to add "mid-tap" connections from the SLB signals to an expanded set of SLB muxes to create a similar function within switch box 302 itself.

Although the present invention has been described in the context of FPGAs having one or more standard-cell logic blocks, those skilled in the art will understand that the present invention can be implemented in the context of other types of programmable logic devices having one or more SLBs.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

We claim:

1. A programmable logic device (PLD), comprising:
   (a) input/output (I/O) circuitry;
   (a) programmable core logic;
   (b) a plurality of standard-cell logic blocks (SLBs) each having a dedicated logic function; and;
   (c) routing resources adapted to provide programmable connections between the SLBs and the core logic, wherein an SLB and the I/O circuitry can be configured together via the routing resources to implement a programmed logic function that includes the dedicated logic function of the SLB.

2. The invention of claim 1, wherein the PLD comprises a plurality of SLBs distributed around the periphery of the PLD.

3. The invention of claim 1, wherein each SLB comprises application-specific integrated circuitry.

4. The invention of claim 1, wherein at least one SLB delivers hard intellectual property that implements one or more customer applications and functions.

5. The invention of claim 1, wherein the routing resources are perimeter-based routing resources.

6. The invention of claim 1, wherein an SLB and the core logic can be configured together via the routing resources to implement a programmed logic function that includes the dedicated logic function of the SLB.

7. A programmable logic device (PLD), comprising:
 (a) input/output (I/O) circuitry;
 (b) programmable core logic;
 (c) memory;
 (d) one or more standard-cell logic blocks (SLBs);
 (e) general routing resources providing programmable connections between the I/O circuitry, the programmable core logic, and the memory; and
 (f) SLB routing resources providing programmable connections between (1) each SLB and (2) any of the I/O circuitry, the programmable core logic, and the memory.

8. The invention of claim 7, wherein the SLB routing resources enable at least one SLB to be programmably connected simultaneously to the I/O circuitry, the core logic, and the memory.

9. The invention of claim 7, wherein, for the at least one SLB, the SLB routing resources comprise:
 a first set of muxes adapted to programmably connect the SLB to one or both of the core logic and the I/O circuitry; and
 a second set of muxes adapted to programmably connect the SLB to one or both of the core logic and the memory.

10. The invention of claim 7, wherein:
 each SLB is adapted to be programmably bypassed;
 if a particular SLB is bypassed, the SLB routing resources associated with the particular SLB are not used; and
 if every SLB is bypassed, all of the SLB routing resources are not used and the PLD functions as a conventional FPGA.

11. The invention of claim 7, wherein the SLB routing resources comprise:
 (1) perimeter-based routing resources adapted to provide programmable connections between each SLB and one or both of the core logic and the I/O circuitry; and
 (2) core-based routing resources adapted to provide programmable connections between each SLB and one or both of the core logic and the memory.

12. The invention of claim 7, wherein the SLB routing resources comprise:
 (1) insertion muxes adapted to programmably insert selected signals into the I/O circuitry, the core logic, and the memory; and
 (2) continuation muxes adapted to programmably continue selected signals around the periphery of the PLD.

13. The invention of claim 7, wherein the SLB routing resources enable one or more I/O buffers in the PLD to be bypassed.

14. The invention of claim 7, wherein the SLB routing resources enable I/O resources associated with an SLB to have a programmable footprint.

15. The invention of claim 7, wherein the SLB routing resources provide programmable connections between at least two SLBs.

16. The invention of claim 7, wherein the SLB routing resources are configurable such that at least one SLB can be inserted into any combination of one or more unidirectional or bidirectional signal paths between (A) any of (i) the I/O circuitry, (ii) the programmable logic core, and (iii) the memory and (B) any of (i) the I/O circuitry, (ii) the programmable logic core, and (iii) the memory.

17. A programmable logic device (PLD), comprising:
 (a) programmable core logic;
 (b) input/output (I/O) circuitry on at least one side of the perimeter of the programmable core logic;
 (c) a plurality of standard-cell logic blocks (SLBs) interspersed within the I/O circuitry; and
 (d) perimeter-based routing resources adapted to provide programmable connections between the SLBs and the I/O circuitry.

18. The invention of claim 17, wherein the I/O circuitry is on all four sides of the perimeter of the programmable core logic.

* * * * *